US012764428B2

(12) United States Patent
Lu

(10) Patent No.: US 12,764,428 B2
(45) Date of Patent: Oct. 13, 2026

(54) SELF-DEFORMABLE CAMERA ARRAY SYSTEM AND DEVICE FOR INTELLIGENT LIGHT FIELD IMAGING

(71) Applicant: TSINGHUA UNIVERSITY, Beijing (CN)

(72) Inventor: Fang Lu, Beijing (CN)

(73) Assignee: Tsinghua University, Beijing (CN)

( * ) Notice: Subject to any disclaimer, the term of this patent is extended or adjusted under 35 U.S.C. 154(b) by 25 days.

(21) Appl. No.: 19/020,137

(22) Filed: Jan. 14, 2025

(65) Prior Publication Data

US 2025/0350855 A1 Nov. 13, 2025

(30) Foreign Application Priority Data

May 7, 2024 (CN) ......................... 202410555881.7

(51) Int. Cl.

*H04N 23/957* (2023.01)
*H04N 23/90* (2023.01)
*H04N 25/705* (2023.01)
*H10F 39/00* (2025.01)

(52) U.S. Cl.

CPC ........... *H04N 23/957* (2023.01); *H04N 23/90* (2023.01); *H04N 25/705* (2023.01); *H10F 39/804* (2025.01); *H10F 39/811* (2025.01)

(58) Field of Classification Search

CPC .... H04N 23/957; H04N 25/705; H04N 23/90; H10F 39/804; H10F 39/811
USPC ...................................................... 348/222.1
See application file for complete search history.

(56) References Cited

U.S. PATENT DOCUMENTS

2021/0190046 A1* 6/2021 Ruzicka .................... G02B 7/08
2023/0269354 A1* 8/2023 Tomren .................. H04N 23/58
348/239

FOREIGN PATENT DOCUMENTS

CN 109341727 A 2/2019

OTHER PUBLICATIONS

Office Action for corresponding CN application 2024105558817, mailed Dec. 7, 2024 (English and Chinese language translations) (21 pages).

* cited by examiner

*Primary Examiner* — Joel W Fosselman
(74) *Attorney, Agent, or Firm* — Maginot, Moore & Beck, LLP

(57) ABSTRACT

A self-deformable camera array system for intelligent light field imaging includes: a flexible image sensor array component, in which the flexible image sensor array component includes a plurality of rigid image sensors and a plurality of flexible stretchable conductors. An island-bridge structure is formed by taking the plurality of rigid image sensors as islands and taking the plurality of flexible stretchable conductors as bridges between the plurality of rigid image sensors.

16 Claims, 5 Drawing Sheets

(a) Examples of images acquired by the deformable system (b) light field reestablishment result obtained by the deformable system

SELF-DEFORMABLE CAMERA ARRAY SYSTEM AND DEVICE FOR INTELLIGENT LIGHT FIELD IMAGING

CROSS-REFERENCE TO RELATED APPLICATIONS

This Application claims the benefit of priority to Chinese Patent Application No. 2024105558817, filed on May 7, 2024, the contents of which are incorporated herein by reference in their entireties for all purposes.

TECHNICAL FIELD

The disclosure relates to the field of array light field imaging technologies, and in particular to a self-deformable camera array system for intelligent light field imaging and a self-deformable camera array device for intelligent light field imaging.

BACKGROUND

With the development and breakthrough of artificial intelligence technologies, especially deep learning, the light field imaging technologies has made great breakthroughs in various aspects such as imaging dimension, scale, performance and robustness. Sensor array light field imaging (hereinafter referred to as "array light field imaging"), as a typical means of the light field imaging, has been widely used in a smartphone imaging system, and has shown great potential for application in different fields such as scientific observation, smart city, public security, and unmanned systems.

In related art, although the application of array light field imaging system may directly or indirectly improve the performance of the imaging system, it also brings more complex optoelectronic system design, larger volume and weight, as well as more demanding working conditions, and thus it might make a compromise between performance and adaptability/portability, and restrict further development and application of the sensor array imaging system.

SUMMARY

A first aspect of embodiments of the disclosure provides a self-deformable camera array system for intelligent light field imaging. The system includes:

- a flexible image sensor array component, in which the flexible image sensor array component includes a plurality of rigid image sensors and a plurality of flexible stretchable conductors;
- in which an island-bridge structure is formed by taking the plurality of rigid image sensors as islands and taking the plurality of flexible stretchable conductors as bridges between the plurality of rigid image sensors.

A second aspect of embodiments of the disclosure provides a self-deformable camera array device for intelligent light field imaging. The device includes a self-deformable camera array system for intelligent light field imaging. The system includes a flexible image sensor array component, the flexible image sensor array component includes a plurality of rigid image sensors and a plurality of flexible stretchable conductors;

- in which an island-bridge structure is formed by taking the plurality of rigid image sensors as islands and taking the plurality of flexible stretchable conductors as bridges between the plurality of rigid image sensors.

Additional aspects and advantages of the disclosure will be given in part in the following descriptions, become apparent in part from the following descriptions, or be learned from the practice of the disclosure.

BRIEF DESCRIPTION OF THE DRAWINGS

The foregoing and/or additional aspects and advantages of the disclosure will become apparent and readily understood from the following descriptions of embodiments in combination with the accompanying drawings, in which.

DETAILED DESCRIPTION

Embodiments of the disclosure are described in detail below, and examples of which are shown in the accompanying drawings, in which the same or similar symbols throughout represent the same or similar elements or elements having the same or similar functions. The embodiments described below with reference to the accompanying drawings are exemplary, and they are used to explain the disclosure and are not to be construed as limiting the disclosure.

A light field, as the name implies, refers to a distribution of a certain physical quantity of the light in a space. Generally, the light field may describe intensity of the light in any direction from any point in the space. The plenoptic function, which completely describes the light field, is a 7-dimensional function, and it contains parameters of coordinates (x, y, z) of any point, any direction ($\Theta$, $\Phi$ in polar coordinates), wavelength ($\lambda$) and time (t). In practical applications, information on color or time dimension is usually represented by different RGB channels and frames. Therefore, for the light field, it is sufficient to focus only on the direction and the position of the light, so that the plenoptic function may be reduced from the 7-dimensional function to a 5-dimensional function.

The plenoptic function may be further simplified to reduce its dimension. Assuming that there are two non-coplanar planes (u, v) and (s, t), and if a ray of light intersects with both of the planes and has an intersection point on each of the planes, the light may be uniquely represented by these two intersection points, and thus a 4D light-field model (u, v, s, t) is obtained. An important assumption for this 4D light field model is that regardless of the position along the direction of propagation of the light, the collected light is the same. In other words, the intensity of the light does not attenuate and the wavelength remains constant during the propagation. Considering that in daily life, light travels a very limited distance from the surface of an object to human eyes, and that the attenuation of the light in the air can be omitted, the above assumption is reasonable.

Figure 1:
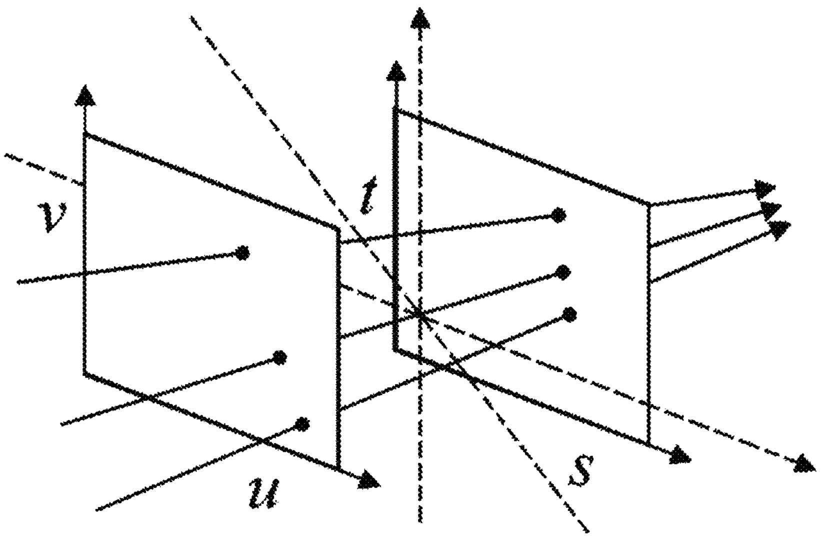
FIG. 1 is a schematic diagram of a 4D light field model provided by an embodiment of the disclosure.

FIG. 1 is a schematic diagram of a 4D light field model provided by an embodiment of the disclosure. As illustrated in FIG. 1, it is impossible for the 4D light field model to describe all the light rays in the 3D space, and light rays parallel to the plane (u, v) or the plane (s, t) cannot be represented by the 4D light field model, such as the light rays represented by dashed lines in FIG. 1.

Although the 4D light field model cannot describe all the light rays in the 3D space, it can fully describe the light rays received by human eyes. Because when a light is in a direction perpendicular to the front view of human eyes, the light does not enter the human eyes. Therefore, this part of light does not affect visual imaging of human eyes. In other words, the 4D light field model not only reduces the dimension required to present the light field, but also fully present all the light rays required for imaging of human eyes. Therefore, this 4D light field model is widely recognized by the academic community, and a great deal of light field-related researches are carried out based on it.

Array light field imaging is a technique for capturing a 3D object scene using a sensor array. It combines the advantages of light-field imaging and array imaging to acquire entire 3D information in a single quick shot. An array light field imaging system, for example, may be a camera array consisting of a plurality of cameras arranged in a fixed pattern, which is capable of capturing spatial information and perspective information simultaneously to achieve efficient acquisition of 3D information.

However, the existing rigid array light field imaging system is developed based on the above 4D light field model. It is designed as a fixed planar (or spherical) array structure, and the interrelationships among sub-aperture sensors in the light field are fixed. As the aperture and baseline of the light field imaging system increase, the volume of the imaging system also increases, which may seriously affect the adaptability of the imaging system.

In recent years, flexible electronics and other emerging technologies have been developing rapidly, and provide new ideas for solving the contradiction between the performance and adaptability of the sensor array imaging system. The flexible electronic technology enables electronic circuits to be flexible, stretchable and foldable, like umbrellas and satellite solar panels, so that the electronic circuits can be opened to increase the working area when needed, and can be folded and stored when not needed.

However, although the flexible electronic technology has made a huge breakthrough, its absolute performance still cannot compete with the developed rigid electronic technology. For example, due to the limitations of the preparation process and integration of the flexible electronic technology, there are only hundreds (16×16) or thousands (32×32) of pixels in the existing flexible image sensor, whereas the number of pixels in the rigid image sensor can reach tens or even hundreds of millions of pixels, which is much higher than that of a fully flexible image sensor.

Therefore, since these emerging technologies are still developing, there are still two major challenges when applying them to the array light field imaging: 1) the existing sensor array light field computation theories and algorithms rely on the strict calibration of rigid geometries, which makes it difficult to support computation and reestablishment of the flexible sensor array; (2) there is still a gap between the performance of the current flexible electronic components and the fully developed technologies, and it is difficult to completely replace the existing sensors and optical lenses.

The disclosure is described in detail below in combination with specific embodiments.

Figure 2:
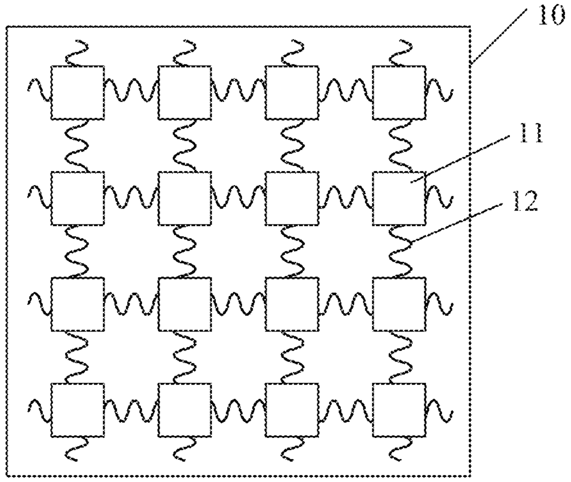
FIG. 2 is a schematic diagram of a self-deformable camera array system for intelligent light field imaging provided by an embodiment of the disclosure.

FIG. 2 is a schematic diagram of a self-deformable camera array system for intelligent light field imaging provided by an embodiment of the disclosure. As illustrated in FIG. 2, the self-deformable camera array system for intelligent light field imaging includes:

- a flexible image sensor array module 10, in which the flexible image sensor array module 10 includes a plurality of rigid image sensors 11 and a plurality of flexible stretchable conductors 12;
- in which an island-bridge structure is formed by taking the plurality of rigid image sensors 11 as islands and taking the plurality of flexible stretchable conductors 12 as bridges among the plurality of rigid image sensors 11 and the plurality of flexible stretchable conductors 12.

According to some embodiments, a rigid image sensor 11 is configured to perceive environment light field information, and a flexible stretchable conductor 12 is configured to transmit a signal of the rigid image sensor 11.

It is easy to understand that the flexible image sensor array module 10 adopts an "island-bridge" hybrid structure, in which the rigid image sensors 11 are islands. The self-deformable camera array system for intelligent light field imaging can achieve high pixel resolution with the aid of the developed technology of the rigid image sensors 11. By using the flexible stretchable conductors 12 as bridges, the flexible image sensor array module 10 as a whole is flexible, stretchable and deformable.

In an implementation, a sensor plane size of the rigid image sensor 11 is less than a sensor plane size threshold. Therefore, the rigid image sensor 11 has less effect on the overall flexibility and stretchability of the self-deformable camera array system for intelligent light field imaging.

In an implementation, the rigid image sensor 11 may be, for example, a rigid complementary metal oxide semiconductor (CMOS) image sensor. The rigid CMOS image sensor may be a rigid CMOS image sensor with a small sensor plane size.

For example, the rigid CMOS image sensor may adopt an OV6946 (1/18"), OV9734 (1/9") module.

In an implementation, the flexible stretchable conductors 12 may be snake-shaped flexible stretchable conductors.

According to some embodiments, key parameters of a snake-shaped flexible stretchable conductor include an arc radius R, a straight line segment length L, and a conductor width w.

The larger the straight line segment length L, the stronger the stretchable capability of the snake-shaped flexible stretchable conductor, and the larger the overall area of the snake-shaped flexible stretchable conductor. Therefore, the density of the flexible image sensor array module 10 may be limited.

The larger the conductor width w, the better the performance of the snake-shaped flexible stretchable conductor, but its deformability and stretchability become weaker.

In an implementation, if one rigid image sensor 11 requires multiple signal lines for output, the flexible stretchable conductor 12 includes a plurality of parallel flexible stretchable sub-conductors.

Figure 3:
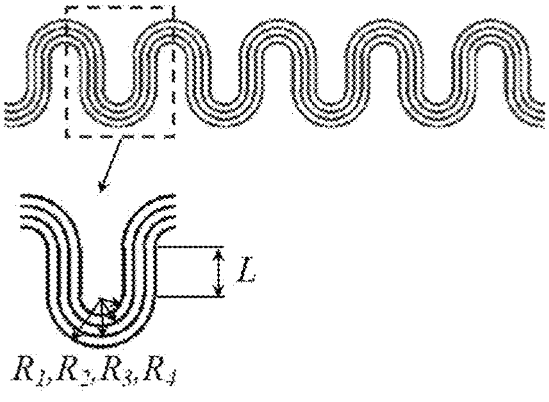
FIG. 3 is a schematic diagram of a flexible stretchable conductor provided by an embodiment of the disclosure.

As a scenario example, FIG. 3 is a schematic diagram of a flexible stretchable conductor provided by an embodiment of the disclosure. As illustrated in FIG. 3, the flexible stretchable conductor is a snake-shaped flexible stretchable conductor, and the snake-shaped flexible stretchable conductor includes four parallel snake-shaped flexible stretchable sub-conductors. The are radiuses R of the four parallel snake-shaped flexible stretchable sub-conductors are R1, R2, R3, and R4, respectively.

According to some embodiments, through tests, it is determined that if the conductor width w of each snake-shaped flexible stretchable sub-conductor in the four parallel snake-shaped flexible stretchable sub-conductors is ranging from 0.2 mm to 0.3 mm, the performance, the flexibility and the stretchability of the flexible stretchable conductor can be balanced.

Figure 4:
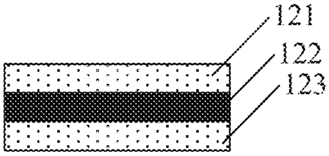
FIG. 4 is a schematic diagram of a cross-section view of a flexible stretchable sub-conductor provided by an embodiment of the disclosure.

FIG. 4 is a schematic diagram of a cross-section view of a flexible stretchable sub-conductor provided by an embodiment of the disclosure. As illustrated in FIG. 4, the flexible stretchable sub-conductor includes a first polyimide layer 121, a copper layer 122, and a second polyimide layer 123 that are stacked in sequence.

According to some embodiments, the flexible stretchable sub-conductor includes a polyimide (PI) layer, a copper (Cu) layer, and a polyimide (PI) layer. It is obtained through flexible circuit board technique and then laser cut, and thus it is possible to balance the performance, the flexibility and the stretchability of the snake-shaped flexible stretchable conductor.

In an implementation, the flexible image sensor array module 10 includes a first polydimethylsiloxane film 13 and a second polydimethylsiloxane film 14;

- rigid image sensors 11 connected to each other via flexible stretchable conductors 12 in the island-bridge structure are welded to a first side of the flexible stretchable conductors 12;
- the first polydimethylsiloxane film 13 is bonded to the first side of the flexible stretchable conductor 12 by pressing, the second polydimethylsiloxane film 14 is bonded to a second side of the flexible stretchable conductor 12 by pressing, there are a plurality of holes provided on the first polydimethylsiloxane film 13 at locations corresponding to the rigid image sensors 11 respectively, to allow the rigid image sensors 11 to pass through the first polydimethylsiloxane film 13 via the holes; and
- polydimethylsiloxane materials are applied around the rigid image sensors 11 that pass through the first polydimethylsiloxane film 13.

According to some embodiments, an upper layer and a lower layer of elastomeric polydimethylsiloxane (PDMS) films are provided in the flexible image sensor array module 10 respectively as a substrate and a protection layer, which are used to dissipate stress in order to protect the rigid image sensors 11 and the flexible stretchable conductors 12.

Figure 5:
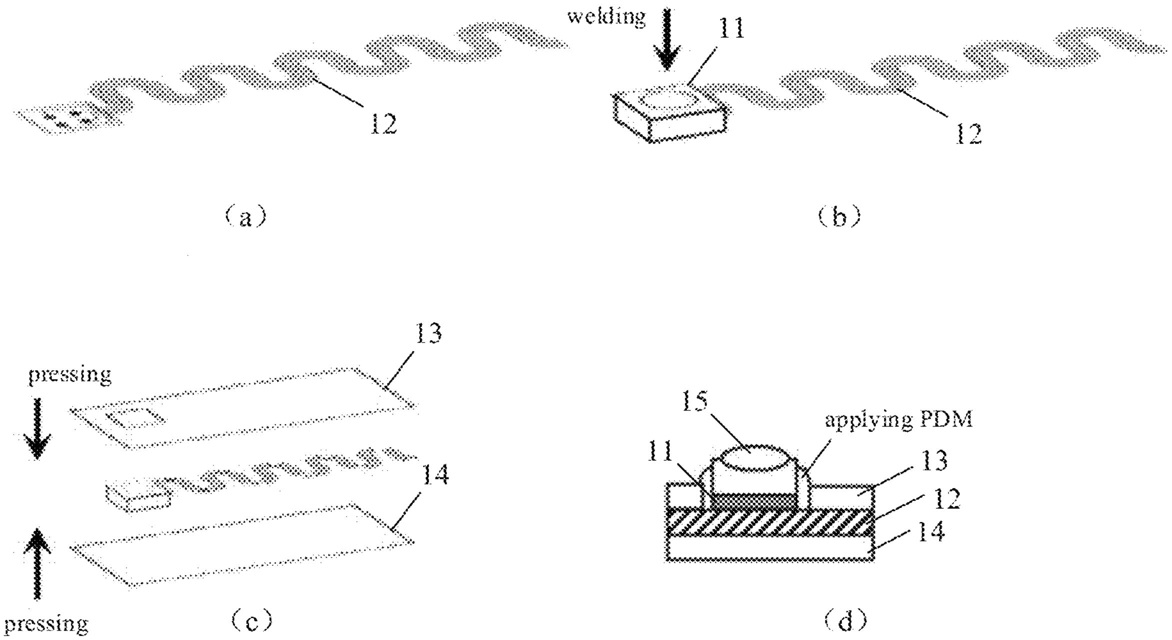
FIG. 5 is a flowchart illustrating a preparation process of a flexible image sensor array module provided by an embodiment of the disclosure.

FIG. 5 is a flowchart illustrates a preparation process of a flexible image sensor array module provided by an embodiment of the disclosure. As illustrated in FIG. 5, the process includes the following steps.

At S101, as illustrated in part (a) in FIG. 5, design and preparation of the flexible stretchable conductor 12 are performed. A pad is provided at one end of each flexible stretchable conductor that is connected to the rigid image sensor 11.

At S102, as illustrated in part (b) in FIG. 5, the rigid image sensor 11 is welded to the pad of the corresponding flexible stretchable conductor 12.

At S103, as illustrated in part (c) in FIG. 5, two PDMS films are provided, and a hole is provided on an upper PDMS film at a location corresponding to the rigid image sensor 11 to form the first polydimethylsiloxane film 13, and the other one is used as the second polydimethylsiloxane film 14. Next, cleaning and activation of surfaces of the first polydimethylsiloxane film 13, the second polydimethylsiloxane film 14 and the flexible stretchable conductor 12 are performed using an oxygen plasma surface treatment device. Finally, the first polydimethylsiloxane film 13 and the second polydimethylsiloxane film 14 are bonded to the flexible stretchable conductor 12 by pressing.

At step S104, as illustrated in part (d) of FIG. 5, PDMS is applied around the rigid image sensor 11 to secure this part of area.

It should be noted that as illustrated in part (d) of FIG. 5, a thin lens 15 is provided on a side of the rigid image sensor 11 away from the flexible stretchable conductor 12.

In some embodiments, a focal length of the thin lens 15 may be adjusted according to different practical working scenarios of the self-deformable camera array system for intelligent light field imaging.

In an implementation, the self-deformable camera array system for intelligent light field imaging also includes: a data reading module 20 and a light field processing module 30;

- the data reading module 20 is configured to read an image data set collected by the plurality of rigid image sensors 11 and send the image data set to the light field processing module 30; and
- the light field processing module 30 is configured to reestablish an environment light field according to the image data set and obtain environment light field information.

According to some embodiments, the data reading module 20 may also be configured to synchronize signals obtained from the rigid image sensors 11, and control the rigid image sensors 11.

Figure 6:
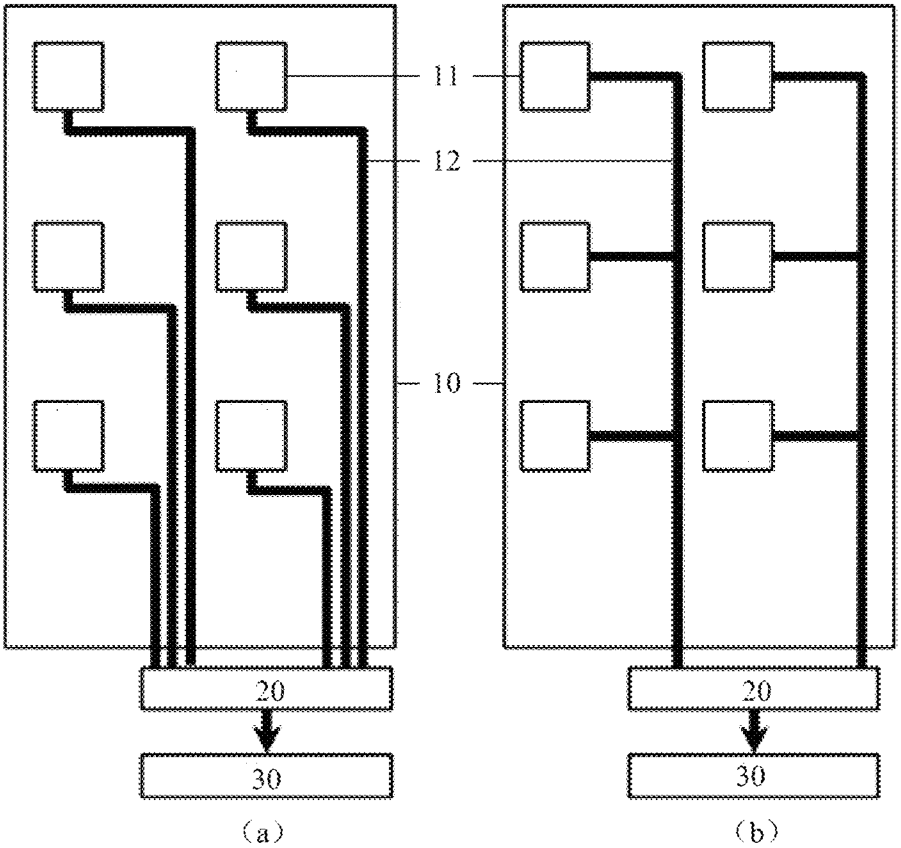
FIG. 6 is a schematic diagram illustrating a design of a flexible stretchable conductor provided by an embodiment of the disclosure.

FIG. 6 is a schematic diagram illustrates a design of a flexible stretchable conductor provided by an embodiment of the disclosure. As illustrated in FIG. 6, the design of flexible stretchable conductor 12 adopts two modes, i.e., parallel reading and serial reading modes.

As illustrated in part (a) of FIG. 6, each of the rigid image sensors 11 is connected to the data reading module 20 via one flexible stretchable conductor 12, and the data reading module 20 reads data from all the rigid image sensors 11 in parallel to obtain the image data set. In this way, the flexible image sensor array module 10 can read data at the quickest speed, and achieve high-speed parallel reading of sensor data.

Alternatively, multiple rigid image sensors 11 are connected to the data reading module 20 via one flexible stretchable conductor 12, and the data reading module 20 reads data from the multiple rigid image sensors 11 in series to obtain the image data set. For example, as shown in part (b) of FIG. 6, there are a total of six rigid image sensors 11, in which three rigid image sensors 11 are connected to the data reading module 20 via one flexible stretchable conductor 12. In this way, an area occupied by the flexible stretchable conductor 12 can be reduced, thereby improving the density of the flexible image sensor array module 10.

According to some embodiments, when the data reading module 20 reads data from the rigid image sensors 11 in in series, it may read data in a time-division multiplexing manner.

Figure 7:
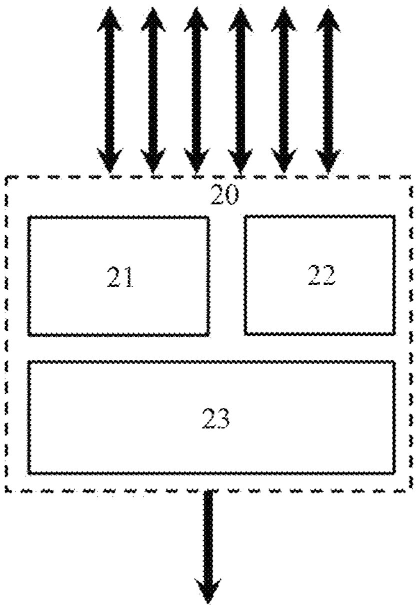
FIG. 7 is a schematic diagram of a data reading module provided by an embodiment of the disclosure.

FIG. 7 is a schematic diagram of a data reading module provided by an embodiment of the disclosure. As illustrated in FIG. 7, the data reading module 20 includes a sensor control sub-module 21, a multi-sensor synchronization sub-module 22 and an image signal processing sub-module 23.

The sensor control sub-module 21 is configured to control sensor parameters of the rigid image sensors 11.

The multi-sensor synchronization sub-module 22 is configured to read an image data set collected by the plurality of rigid image sensors 11 and synchronize the data of the plurality of rigid image sensors 11.

The image signal processing sub-module 23 is configured to optimize the image data set and send the optimized image data set to the light field processing module 30.

According to some embodiments, the sensor parameters include, but are not limited to, exposure, gain, and other parameters.

In some embodiments, the multi-sensor synchronization sub-module 22 reads the image data set collected by the plurality of rigid image sensors 11 through an interface. The interface includes various interface forms, which include but are not limited to, an analog interface, a mobile industry processor interface (MIPI), and other interfaces.

According to some embodiments, when the image signal processing sub-module 23 optimizes the image data set, it may perform real-time processing and optimization on the image data set, thereby improving the image quality of the image data set and enhancing details.

In some embodiments, the optimization method includes, but is not limited to, noise removal, white balance, etc.

According to some embodiments, the image signal processing sub-module 23 sends the optimized image data set to the light field processing module 30 through an interface. The interface includes various interface forms, which include but are not limited to, a cameralink, a USB, and other common interfaces.

In some embodiments, the optimized image data set may be, for example, a light field array image (also known as a sensor array image).

In an implementation, the light field processing module 30 includes an environment perception sub-module 31 and a body perception sub-module 32.

The environment perception sub-module 31 is configured to extract semantic information of each image data in the image data set according to a visual base model, and estimate first three-dimensional depth information corresponding to each image data according to the semantic information.

The body perception sub-module 32 is configured to establish a feature point association relationship between different image data in the image data set, perform an array image-light field three-dimensional joint optimization according to the first three-dimensional depth information and the feature point association relationship and obtain pose information and second three-dimensional depth information corresponding to each image data, and reestablish a body pose corresponding to the flexible image sensor array module according to the pose information.

The environment perception sub-module 31 is further configured to combine the body pose and the second three-dimensional depth information to obtain environment light field information.

According to some embodiments, the visual base model may be, for example, a large model.

Figure 8:
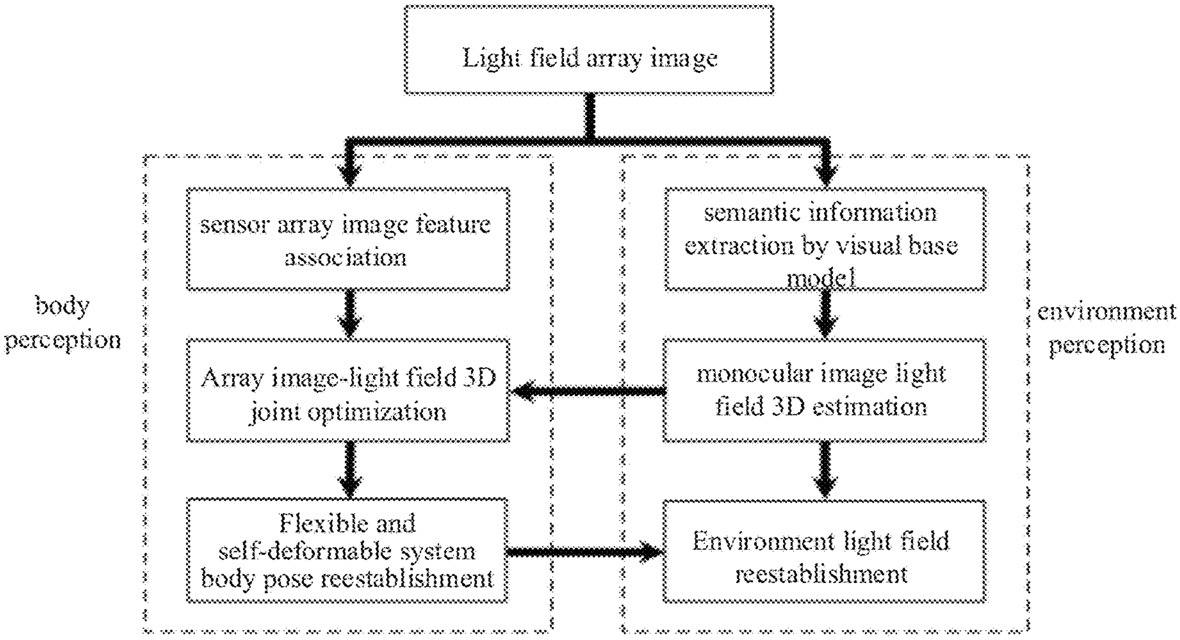
FIG. 8 is a schematic diagram illustrating a working process of a light field processing module provided by an embodiment of the disclosure.

FIG. 8 is a schematic diagram illustrating a working process of a light field processing module provided by an embodiment of the disclosure. As illustrated in FIG. 8, the environment perception sub-module 31 and the body perception sub-module 32 feedback to each other, and the specific process is provided as follows.

At S201, the environment perception sub-module 31 extracts semantic information from sensor array images using a visual base model.

At S202, the environment perception sub-module 31 performs 3D light field estimation using the semantic information according to a monocular image to obtain monocular 3D depth information of each image, in which the monocular image refers to any one of the sensor array images. For example, S202 can be implemented by using visual base model techniques such as monocular image depth estimation, or by training a dedicated monocular 3D estimation neural network.

At S203, the body perception sub-module 32 establishes a feature point association relationship between the sensor array images.

At S204, the body perception sub-module 32 establishes a physical constraint according to the feature point association relationship between the sensor array images and the monocular 3D depth information of each image, and performs an array image-light field 3D joint optimization based on a camera projection model, and jointly optimizes pose information of each rigid image sensor 11 and corresponding monocular 3D depth information.

At S205, the body perception sub-module 32 reestablishes a body pose of the self-deformable camera array system for intelligent light field imaging according to the pose information of the rigid image sensors 11.

At S206, the environment perception sub-module 31 combines the body pose and the optimized monocular 3D depth information to obtain the environment light field information.

Figure 9:
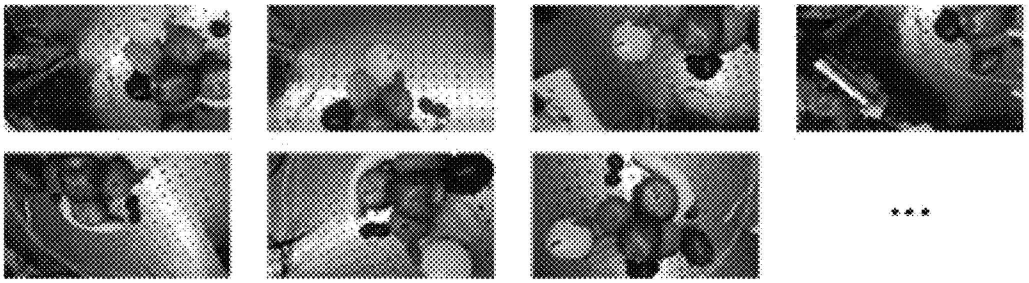
FIG. 9 is a schematic diagram illustrating image results of the self-deformable camera array system for intelligent light field imaging provided by an embodiment of the disclosure.
Figure 9:
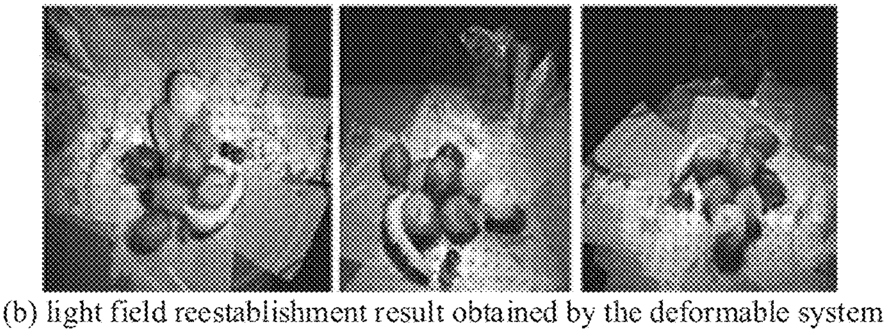

FIG. 9 is a schematic diagram illustrating image results of the self-deformable camera array system for intelligent light field imaging provided by an embodiment of the disclosure. Part (a) of FIG. 9 illustrates an image data set collected by the rigid image sensors 11, and part (b) of FIG. 9 illustrates a light field reestablishment result obtained by performing environment light field reestablishment for the image data set.

It is easy to understand that the light field processing module 30 extracts the semantic information and 3D information of scenes and instance objects using visual base model techniques such as monocular image depth estimation, establishes the physical constraint, and optimizes the system body pose and the environment light field information simultaneously based on the camera projection model, to realize the light field intelligent reestablishment without calibration parameters for variable system forms.

Figure 10:
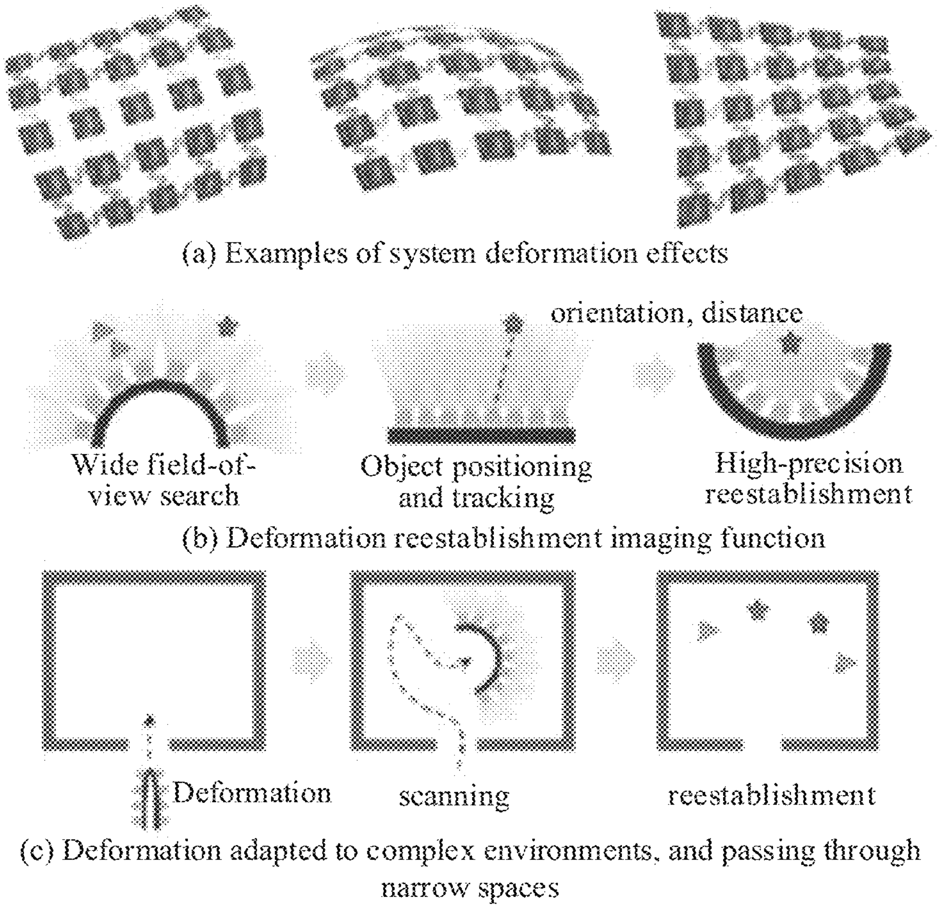
FIG. 10 is a schematic diagram illustrating applications of the self-deformable camera array system for intelligent light field imaging provided by an embodiment of the disclosure.

FIG. 10 is a schematic diagram illustrating applications of the self-deformable camera array system for intelligent light field imaging provided by an embodiment of the disclosure. As illustrated in FIG. 10, the self-deformable camera array system for intelligent light field imaging is flexible, deformable, adaptable and reconfigurable.

As illustrated in part (a) of FIG. 10, due to the flexible and stretchable characteristics of the flexible stretchable conductor 12, the self-deformable camera array system for intelligent light field imaging as a whole is flexible, deformable and stretchable, and is able to intelligently change into different forms to adapt to complex surface shapes, which can be applied to different fields such as robotics, wearable devices, etc., in the future.

As illustrated in parts (b) and (c) of FIG. 10, in robot application scenes, the self-deformable camera array system for intelligent light field imaging may change its own shape to switch between functions such as wide field-of-view search, high-precision reestablishment, object positioning and tracking. Meanwhile, the self-deformable camera array system for intelligent light field imaging has very high adaptability, and can use its deformation capability to pass through various narrow spaces and then extend and perform the imaging capability. In this way, high-integrity and high-precision reestablishment of the environment light field can be realized.

In conclusion, by adopting the rigid-deformable "island-bridge" structure, the system provided by the embodiments takes the rigid CMOS image sensor with small sensor plane size as the "island" to achieve high pixel resolution with the aid of developed technologies, and takes the flexible stretchable conductor as the "bridge", so that the entire system is flexible, stretchable and deformable. Secondly, through the data reading module and the light field processing module, in combination with the monocular depth estimation capability of the visual base model (large model) and the traditional camera projection model, body perception (flexible and self-deformable system body pose reestablishment) and environment perception (environment light field reestablishment) without calibration parameters can be realized for variable forms, thereby realizing high integrity and high precision reestablishment of the environment light field.

In order to realize the above embodiments, the disclosure also provides a self-deformable camera array device for intelligent light field imaging. The device includes the self-deformable camera array system for intelligent light field imaging provided by the above embodiments. The device may be, for example, an electronic device.

The collection, storage, usage, processing, transmission, provision and disclosure of private information of users involved in the disclosure comply with the provisions of relevant laws and regulations, and do not violate public order and good customs.

It should be noted that the private information of the users should be collected for legal and reasonable purposes and not shared or sold for other purposes beyond legal usage. In addition, such collection/sharing shall be carried out after receiving the informed consent of the users, including but not limited to informing users to read a user agreement/user notice and signing an agreement/authorization for authorizing the user information before using this function. In addition, it is necessary to take any necessary steps to secure and guarantee access to such private information and ensure that others who have access to the private information comply with the privacy policies and procedures.

The disclosure is expected to provide an implementation scheme in which the users can selectively prevent the usage or access of private information. That is, the disclosure is expected to provide hardware and/or software to prevent or stop access to the private information. Once the private information is no longer needed, by preventing data collection and deleting data, risks can be minimized. In addition, personal IDs shall be removed from the private information when being applied to protect user privacy.

In the description of the embodiments of the disclosure, the reference terms "an embodiment", "some embodiments", "example", "specific example", and "some examples" and the like are intended to describe specific features, structures, materials, or characteristics described in combination with the embodiment or example are included in at least one embodiment or example of the disclosure. In the disclosure, the schematic expressions of the above terms do not have to be directed to the same embodiments or examples. Moreover, the specific features, structures, materials, or characteristics described may be combined in a suitable manner in any one or more embodiments or examples. In addition, without contradicting each other, those skilled in the art may combine different embodiments or examples described in the disclosure with features of different embodiments or examples.

In the description of this disclosure, the terms "first" and "second" are used for descriptive purposes only, and are not to be construed as indicating or implying relative importance or implicitly indicating the number of technical features indicated. Therefore, the features including the terms "first" and "second" may explicitly or implicitly indicate at least one such feature. In the description of this disclosure, "plurality" means at least two, e.g., two and three, unless otherwise expressly and specifically limited.

Any process or method described in a flowchart or described herein in other ways may be understood to include one or more modules, segments or portions of codes of executable instructions for achieving specific logical functions or steps in the process, and the scope of preferred embodiments of the disclosure includes other implementations. It should be understood by those skilled in the art to which the embodiments of the disclosure belong that functions may be performed in orders other than those shown or discussed herein, including in a substantially simultaneous manner or in a reverse order, depending on the functions involved.

The logic and/or step described in other manners herein or shown in the flowchart, for example, a particular sequence table of executable instructions for realizing the logical function, may be specifically achieved in any computer readable medium to be used by an instruction execution system, device or equipment (e.g., the system based on computers, the system including processors or other systems capable of obtaining instructions from the instruction execution system, device or equipment and executing the instructions), or to be used in combination with the instruction execution system, device or equipment. As to the specification, "computer readable medium" may be any device adaptive for including, storing, communicating, propagating or transferring programs to be used by or in combination with the instruction execution system, device or equipment. More specific examples (non-exclusive examples) of the "computer readable medium" include but are not limited to: an electronic connection (an electronic device) with one or more wires, a portable computer enclosure (a magnetic device), a Read-Only Memory (ROM), a Random Access Memory (RAM), an erasable programmable read-only memory (EPROM or a flash memory), an optical fiber device and a portable compact disk read-only memory (CDROM). In addition, the computer readable medium may even be a paper or other appropriate mediums capable of printing programs thereon. For example, the paper or other appropriate mediums may be optically scanned and then edited, decrypted or processed with other appropriate methods when necessary to obtain the programs in an electric manner. The programs may be stored in the computer memories.

It should be understood that each part of the disclosure may be realized by a hardware, software, firmware or their combinations. In the above implementations, a plurality of steps or methods may be realized by the software or firmware stored in a memory and executable by an appropriate instruction execution system. For example, if the disclosure is realized by the hardware, likewise in another embodiment, the steps or methods may be realized by one of or a combination of the following techniques known in the art: a discrete logic circuit having a logic gate circuit for realizing a logic function of a data signal, an application-specific integrated circuit having an appropriate combination logic gate circuit, a programmable gate array (PGA), a field programmable gate array (FPGA), etc.

It is understood by those skilled in the art that all or a part of the steps carried by the method in the above-described embodiments may be completed by relevant hardware instructed by a program. The program may be stored in a computer readable storage medium. When the program is executed, one of or a combination of the steps of the above-described method embodiments may be implemented.

In addition, individual functional units in the embodiments of the disclosure may be integrated in one processing module or may be separately physically present, or two or more units may be integrated in one module. The integrated module as described above may be achieved in the form of hardware, or may be achieved in the form of a software functional module. If the integrated module is achieved in the form of a software functional module and sold or used as a separate product, it may also be stored in a computer readable storage medium.

The storage medium mentioned above may be a ROM, a disk or CD-ROM. Although embodiments of disclosure have been shown and described above, it should be understood that above embodiments are just exemplary, and cannot be construed to limit the disclosure. For those skilled in the art, changes, modifications, substitutions and variations can be made to the above embodiments without departing from the scope of the disclosure.

What is claimed is:

1. A self-deformable camera array system for intelligent light field imaging, comprising:

a flexible image sensor array component, the flexible image sensor array component comprising a plurality of rigid image sensors and a plurality of flexible stretchable conductors;

wherein an island-bridge structure is formed by taking the plurality of rigid image sensors as islands and taking the plurality of flexible stretchable conductors as bridges between the plurality of rigid image sensors, wherein the flexible image sensor array component further comprises a first polydimethylsiloxane film and a second polydimethylsiloxane film;

rigid image sensors connected to each other via flexible stretchable conductors in the island-bridge structure are welded to a first side of the flexible stretchable conductors;

the first polydimethylsiloxane film is bonded to the first side of the flexible stretchable conductor by pressing, the second polydimethylsiloxane film is bonded to a second side of the flexible stretchable conductor by pressing, a plurality of holes are provided on the first polydimethylsiloxane film at locations corresponding to the rigid image sensors respectively, and the rigid image sensors pass through the first polydimethylsiloxane film via the holes; and polydimethylsiloxane materials are applied around the rigid image sensors that pass through the first polydimethylsiloxane film.

2. The system of claim 1, wherein a sensor plane size of a rigid image sensor is less than a sensor plane size threshold.

3. The system of claim 1, wherein the flexible stretchable conductor are snake-shaped flexible stretchable conductors, a snake-shaped flexible stretchable conductor comprises a plurality of parallel snake-shaped flexible stretchable sub-conductors, and a snake-shaped flexible stretchable sub-conductor comprises a first polyimide layer, a copper layer, and a second polyimide layer that are stacked in sequence.

4. The system of claim 3, wherein the snake-shaped flexible stretchable conductor comprises four parallel snake-shaped flexible stretchable sub-conductors, and a conductor width of the snake-shaped flexible stretchable sub-conductor is ranging from 0.2 mm to 0.3 mm.

5. The system of claim 1, further comprising:

a data reader, configured to read an image data set collected by the plurality of rigid image sensors and send the image data set to the light field processor; and a light field processor, configured to reestablish an environment light field according to the image data set and obtain environment light field information.

6. The system of claim 5, wherein each of the rigid image sensors is connected to the data reader via one flexible stretchable conductor, and the data reader reads data from all the rigid image sensors in parallel and obtains the image data set; or multiple rigid image sensors are connected to the data reader via one flexible stretchable conductor, and the data reader reads data from the multiple rigid image sensors in series and obtains the image data set.

7. The system of claim 5, wherein the data reader comprises a sensor controller, a multi-sensor synchronizing device and an image signal processor;

the sensor controller is configured to control sensor parameters of the rigid image sensors;

the multi-sensor synchronizing device is configured to read an image data set collected by the plurality of rigid image sensors and synchronize the data of the plurality of rigid image sensors; and the image signal processor is configured to optimize the image data set and send the optimized image data set to the light field processor.

8. The system of claim 5, wherein the light field processor comprises an environment perception processor and a body perception processor;

the environment perception processor is configured to extract semantic information of each image data in the image data set according to a visual base model, and estimate first three-dimensional depth information corresponding to each image data according to the semantic information;

the body perception processor is configured to establish a feature point association relationship between different image data in the image data set, perform an array image-light field three-dimensional joint optimization according to the first three-dimensional depth information and the feature point association relationship and obtain pose information and second three-dimensional depth information corresponding to each image data, and reestablish a body pose corresponding to the flexible image sensor array component according to the pose information; and the environment perception processor is further configured to combine the body pose and the second three-dimensional depth information to obtain the environment light field information.

9. A self-deformable camera array device for intelligent light filed imaging, comprising a self-deformable camera array system for intelligent light field imaging, wherein the self-deformable camera array system for intelligent light field imaging comprises a flexible image sensor array component, the flexible image sensor array component comprising a plurality of rigid image sensors and a plurality of flexible stretchable conductors;

wherein an island-bridge structure is formed by taking the plurality of rigid image sensors as islands and taking the plurality of flexible stretchable conductors as bridges between the plurality of rigid image sensors, wherein the flexible image sensor array component further comprises a first polydimethylsiloxane film and a second polydimethylsiloxane film;

rigid image sensors connected to each other via flexible stretchable conductors in the island-bridge structure are welded to a first side of the flexible stretchable conductors;

the first polydimethylsiloxane film is bonded to the first side of the flexible stretchable conductor by pressing, the second polydimethylsiloxane film is bonded to a second side of the flexible stretchable conductor by pressing, a plurality of holes are provided on the first polydimethylsiloxane film at locations corresponding to the rigid image sensors respectively, and the rigid image sensors pass through the first polydimethylsiloxane film via the holes; and polydimethylsiloxane materials are applied around the rigid image sensors that pass through the first polydimethylsiloxane film.

10. The device of claim 9, wherein a sensor plane size of a rigid image sensor is less than a sensor plane size threshold.

11. The device of claim 9, wherein the flexible stretchable conductor are snake-shaped flexible stretchable conductors, a snake-shaped flexible stretchable conductor comprises a plurality of parallel snake-shaped flexible stretchable sub-conductors, and a snake-shaped flexible stretchable sub-conductor comprises a first polyimide layer, a copper layer, and a second polyimide layer that are stacked in sequence.

12. The device of claim 11, wherein the snake-shaped flexible stretchable conductor comprises four parallel snake-shaped flexible stretchable sub-conductors, and a conductor width of the snake-shaped flexible stretchable sub-conductor is ranging from 0.2 mm to 0.3 mm.

13. The device of claim 9, wherein the self-deformable camera array system for intelligent light field imaging further comprises a data reader and a light field processor;

the data reader is configured to read an image data set collected by the plurality of rigid image sensors and send the image data set to the light field processor; and the light field processor is configured to reestablish an environment light field according to the image data set and obtain environment light field information.

14. The device of claim 13, wherein each of the rigid image sensors is connected to the data reader via one flexible stretchable conductor, and the data reader reads data from all the rigid image sensors in parallel and obtains the image data set; or multiple rigid image sensors are connected to the data reader via one flexible stretchable conductor, and the data reader reads data from the multiple rigid image sensors in series and obtains the image data set.

15. The device of claim 13, wherein the data reader comprises a sensor controller, a multi-sensor synchronizing device and an image signal processor;

the sensor controller is configured to control sensor parameters of the rigid image sensors;

the multi-sensor synchronizing device is configured to read an image data set collected by the plurality of rigid image sensors and synchronize the data of the plurality of rigid image sensors; and the image signal processor is configured to optimize the image data set and send the optimized image data set to the light field processor.

16. The device of claim 13, wherein the light field processor comprises an environment perception processor and a body perception processor;

the environment perception processor is configured to extract semantic information of each image data in the image data set according to a visual base model, and estimate first three-dimensional depth information corresponding to each image data according to the semantic information;

the body perception processor is configured to establish a feature point association relationship between different image data in the image data set, perform an array image-light field three-dimensional joint optimization according to the first three-dimensional depth information and the feature point association relationship and obtain pose information and second three-dimensional depth information corresponding to each image data, and reestablish a body pose corresponding to the flexible image sensor array component according to the pose information; and the environment perception processor is further configured to combine the body pose and the second three-dimensional depth information to obtain the environment light field information.

* * * * *